United States Patent [19]

Neduva

[11] Patent Number: 5,612,916
[45] Date of Patent: Mar. 18, 1997

[54] MEMORY BYPASS MODE

[75] Inventor: Alex Neduva, Migdal HA'Emek, Israel

[73] Assignee: Intel Corporation, Santa Clara, Calif.

[21] Appl. No.: 707,925

[22] Filed: Sep. 10, 1996

Related U.S. Application Data

[62] Division of Ser. No. 576,705, Dec. 20, 1995, Pat. No. 5,592,425.

[51] Int. Cl.[6] ............................................. G11C 7/00
[52] U.S. Cl. ................................ 365/189.04; 365/201
[58] Field of Search .......................... 365/189.04, 189.01, 365/189.02, 189.05, 201

[56] References Cited

U.S. PATENT DOCUMENTS

| | | | |
|---|---|---|---|
| 4,599,708 | 7/1986 | Schster | 365/189.04 |
| 4,616,341 | 10/1986 | Andersen et al. | 365/189.04 |
| 4,663,742 | 5/1987 | Andersen | 365/189.04 |
| 4,737,933 | 4/1988 | Chiang et al. | 365/189.05 |
| 4,766,572 | 8/1988 | Kobayashi | 365/189.05 |
| 4,998,221 | 5/1991 | Correale, Jr. | 365/189.04 |
| 5,077,689 | 12/1991 | Ahn | 365/201 |
| 5,151,983 | 9/1992 | Nishiguchi | 365/189.05 |
| 5,255,239 | 10/1993 | Taborn | 365/201 |
| 5,287,326 | 2/1994 | Hirata | 365/230.03 |
| 5,371,708 | 12/1994 | Kobayashi | 365/230.01 |
| 5,396,464 | 3/1995 | Slemmer | 365/201 |
| 5,488,578 | 1/1996 | Yamada | 365/49 |

*Primary Examiner*—Tan T. Nguyen
*Attorney, Agent, or Firm*—Blakely, Sokoloff, Taylor & Zafman

[57] ABSTRACT

A bypass mode for an SRAM permitting data to be coupled from the write drivers to the sense amplifier without being written into the cells. The bypass mode is used during testing and is implemented by simultaneously activating the write drivers and sense amplifiers while inhibiting selection of any of the cells in the array. In effect the bitlines in the array are used as bus lines for directly coupling data through the array. The bypass mode eliminates the need for the lines used to couple a bit pattern to a compare circuit during testing thereby saving substrate cover.

4 Claims, 3 Drawing Sheets

MEMORY BYPASS MODE

This is a divisional of application Ser. No. 08/576,705, filed Dec. 20, 1995, now U.S. Pat. No. 5,592,425.

BACKGROUND OF THE INVENTION

1. Field of the Invention

The invention relates to the field of memories such as random access memories (RAMs) having memory cells coupled to bitlines.

2. Prior Art

Integrated circuits frequently include RAMs embedded within a larger circuit. For instance, microprocessors sometimes include on-board cache memories and similarly, integrated circuits designed for communications sometimes include RAM for buffering data between networks or a network and a computer. In these instances, the memory is frequency not directly accessible from external terminals. That is, all the address lines and input/output lines of the memory may not be directly coupled to terminals or pads which are externally accessible. For this reason, the testing of these memories becomes more difficult and often requires that the integrated circuit include circuitry for testing the memory. This is in contrast to a memory "chip" such as commercially available DRAM or SRAM chips where all the address lines and data lines are coupled to terminals of the chip allowing the memory array to be fully accessed for testing without special circuitry.

FIG. 1 illustrates a prior art memory embedded in an integrated circuit. The memory includes an array 10 of memory cells having a plurality of bitline pairs which extend from write drivers 11 to the sense amplifiers 12. A single bitline pair and a single memory cell 18 connected to the bitline pair are shown in FIG. 1. The cells which are often bistable (static) memory cells are selected by word lines such as word line 19. A row of cells is selected by an active word line either for writing data by write drivers 11 or for sensing data from the selected cells by the sense amplifiers 12. Both the writing and reading of data occurs over the bitlines. The write drivers 11, memory array 10 and sense amplifiers 12 are well-known in the prior art and are used in numerous integrated circuits.

For the illustrated prior art of FIG. 1, data is written into the memory from a register 13. The register 13 is a parallel/serial, shift/load register which receives data (in parallel) over lines 15. For the illustrated memory the register 13 has 70 stages to accommodate the memory array 10 which is 70 cells wide. That is, there are 70 pairs of bitlines, 70 write drivers 11 and 70 sense amplifiers 12. Data read from the memory through the sense amplifiers 12 is coupled to a register 14. The register 14 is a parallel/serial, shift/load register.

For purposes of testing the memory array 10 a bit pattern representing data is typically written into the memory and then read from the memory. The data read from the memory is then compared with the data written into the memory to determine if the data read from the memory is the same as the data written into the memory. This testing verifies that the array and the drivers and sense amplifiers are functioning properly. Test patterns of ones and zeros are used for each of the rows of memory cells to fully exercise the memory as is well-known in the art.

For the memory illustrated in FIG. 1, the output of the register 14 is compared in the compare circuit 17 with a bit pattern stored in the register 13. The pattern stored in the register 13 is coupled to the compare circuit 17 through the lines 16. For purposes of testing the memory a bit pattern is transferred into the register 13 either serially or in parallel and then written into a selected row of cells in the memory over the bitlines. Then a read cycle is used to access the cells and read the data over the bitlines using the sense amplifiers 12. The data defining the bit pattern is placed into the register 14. This bit pattern is then coupled from the register 14 to the compare circuit 17 and compared with the contents of the register 13. If the contents are equal, the data was faithfully written into and read from the memory cells. In this manner each row of cells in the array 10 is tested.

A problem with the circuit of FIG. 1 is that the bit pattern from the register 13 must be coupled to the compare circuit 17 as shown by the lines 16. For the illustrated embodiment, at least 70 lines are needed, one for each bit, if the testing is to be accomplished quickly. The 70 lines 16 are routed on the substrate spaced apart from the array 10 and as such, require substrate area. The substrate area for these 70 lines, as can be appreciated, is a relatively significant amount of area when compared to the RAM itself. (In some cases more than one RAM is used in an integrated circuit.)

It should be noted that the lines 16 cannot easily be routed over the top of the array 10. Generally, the array 10 requires use of all of the available metal layers of a process, and moreover, because of the sensitivity associated with the bitlines in the array, the coupling caused by additional lines over the array may affect the performance of the array.

As will be seen with present invention, the array 10 of FIG. 1 is tested without the use of the lines 16 and consequently, substrate area is saved as will be discussed.

SUMMARY OF THE INVENTION

In one embodiment, the bitlines of the memory are used by simultaneously writing onto the bitlines while reading from the bitlines and at the same time, suppressing signals on the word lines such that no cells are selected. In this manner, the bit pattern bypasses the cells and, in effect, the bitlines of the array are used as buses for coupling the test pattern to a compare circuit.

DETAILED DESCRIPTION OF THE PRESENT INVENTION

A bypass mode used for the testing of a random access memory (RAM) such as a static RAM embedded in an integrated circuit is described. In the following description numerous specific details are set forth such as specific number of bitlines in order to provide a thorough understanding of the present invention and its benefits. It will be apparent, however, to one skilled in the art that the present invention may be practiced without these specific details. In other instances, well-known circuits such as drivers, sense amplifiers and memory cells are not shown in detail in order not to obscure the present invention.

Figure 1:
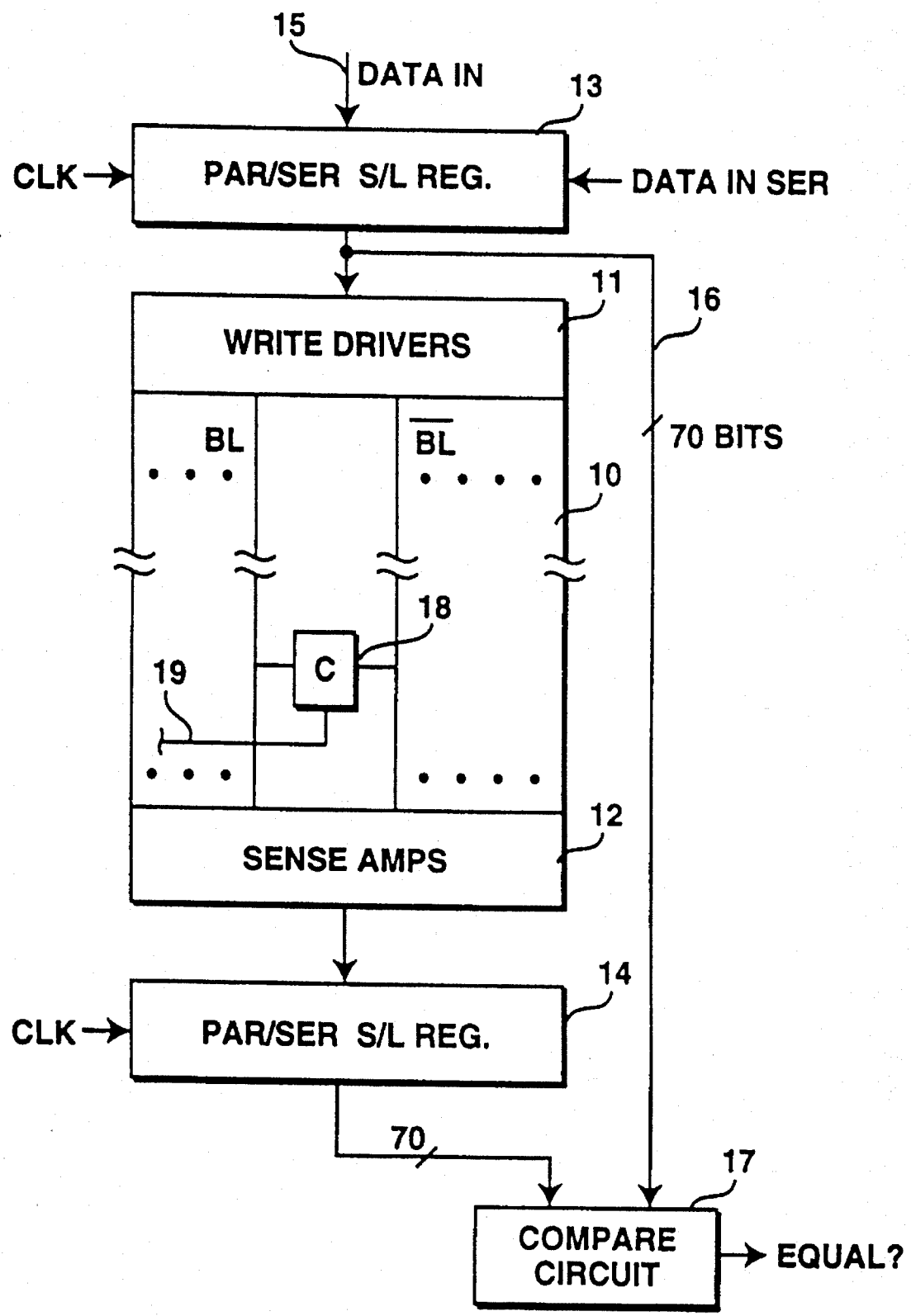
FIG. 1 is a block diagram illustrating a portion of a prior art integrated circuit. More particularly, a memory in the circuit and the circuitry used for testing the memory are shown.
Figure 2:
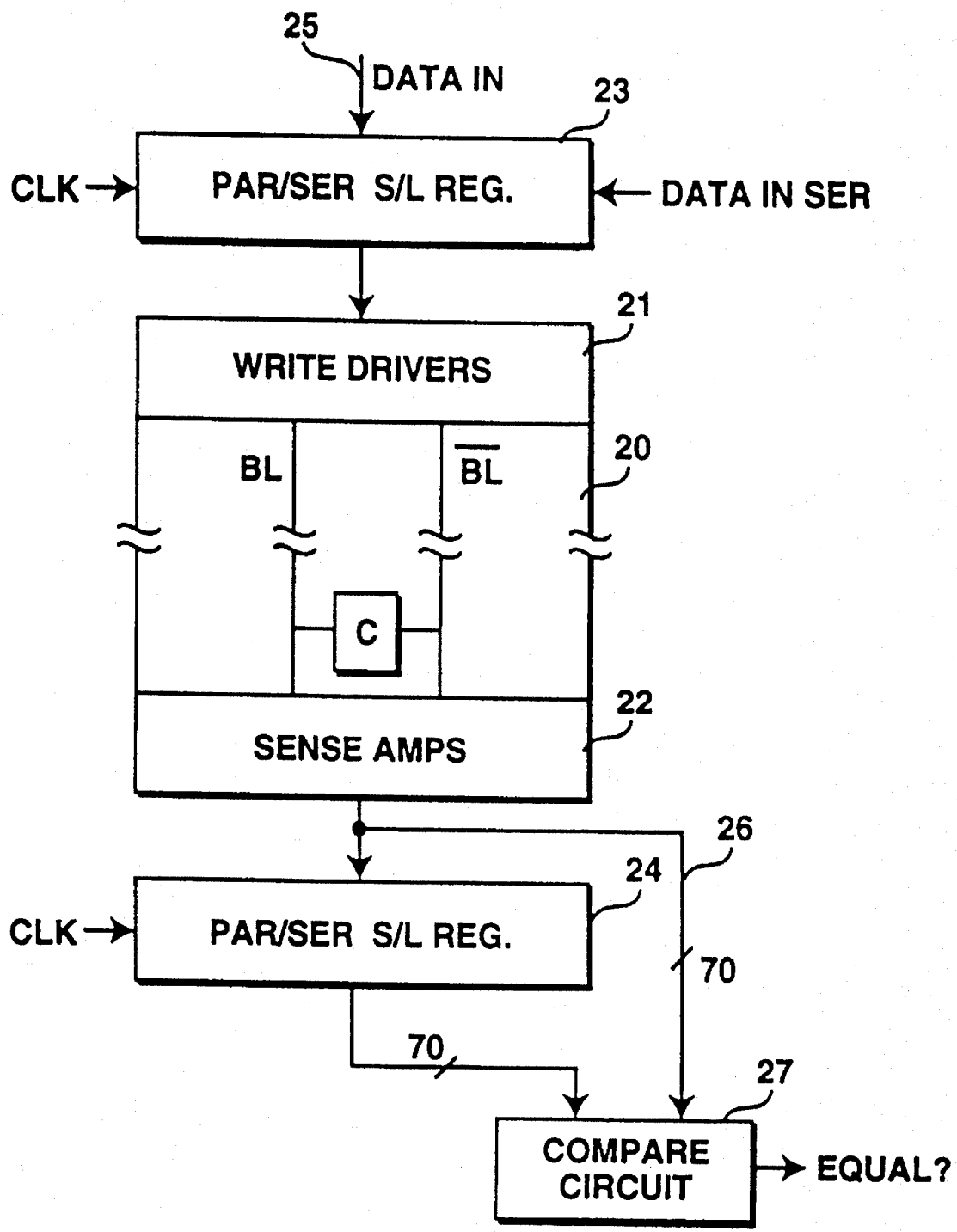
FIG. 2 is a block diagram of a memory such as shown in FIG. 1 with the improvement of the present invention.

In FIG. 2 the memory of FIG. 1 is again illustrated without the lines 16 of FIG. 1 and with the improvement of the present invention. Again, a memory array 20 is illustrated having a plurality of complementary bitlines with a single pair of bitlines being shown. Write drivers 21 are used to write data into memory cells of the array and the data from the cells is sensed by the sense amplifiers 22. A register 23 corresponding to register 13 of FIG. 1 is illustrated coupled to a bus 25 for communicating data to the write drivers 21. Also, a register 24 corresponding to register 14 of FIG. 1 is shown in FIG. 2.

With the improvement of the present invention, a path comprising lines 26 is used which couples the output of the sense amplifiers 22 to a compare circuit 27. This compare circuit corresponds to the compare circuit 17 of FIG. 1. The other input to the compare circuit 17 is the parallel output of the register 24. Note that in FIG. 2 the lines 16 of FIG. 1 are not used, rather the lines 26 are used to provide an input to the compare circuit 27. However, as can be seen by comparing FIGS. 1 and 2 the lines 26 may be substantially shorter in length than lines 16.

With the present invention a bit pattern is latched in the register 23. This pattern is then written into cells of the array 20 through the write drivers 21 and stored within the cells. The data is next read from the cells by the sense amplifiers 22 and stored in the register 24. Both this writing and reading occurs over the bitlines in the array using a write cycle and read cycle, respectively. This provides one pattern used in the comparison.

The other pattern for the comparison which typically is identical to the first pattern is coupled from the register 23 directly through the array 20 to the lines 26 without being stored in any of the memory cells of the array 20. That is, the bitlines of the array 20 now are used solely to couple data from one end of the array to the other and not for their normal function of coupling data for writing into cells or coupling data from the cells to the sense amplifiers. The bit pattern which is coupled through the array 20 bypassing the cells after being sensed by the sense amplifiers 22 is coupled to the compare circuit 27 through the lines 26 and then compared to the first pattern stored in the register 24. The testing of the memory may proceed in the same manner as used for the array of FIG. 1 except that the lines 26 are used for coupling one of the bit patterns to the compare circuit 27.

Alternately, for testing of the array 20 a pattern may be first coupled through the array 20 and latched in the register 24 without being stored in any of the memory cells. A second pattern may then be coupled from the register 23 and written into the cells of the memory 20. As the data is read from the cells by the sense amplifiers 22 it is coupled by the lines 26 to the circuit 27 and compared with the first pattern previously latched within the register 24. Thus, the bypass mode may be used before or after a bit pattern is written into and read from the array. Consequently, for purposes of the illustrated embodiment of the present invention, it does not matter whether the bypassing of the memory cells occurs before or after the bit pattern is written into and read from the cells.

Figure 3:
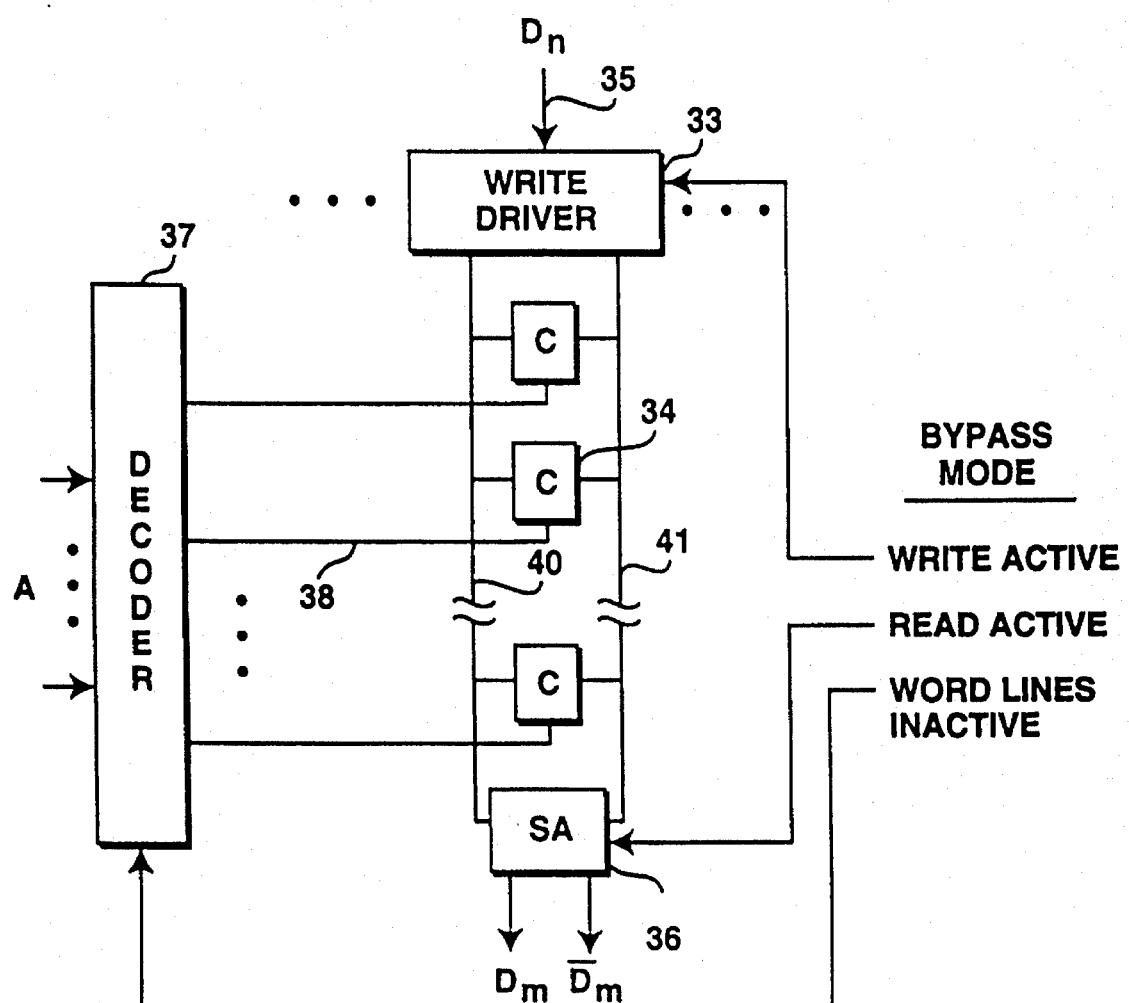
FIG. 3 is a block diagram illustrating a portion of a memory array and the signals used to provide the bypass mode of the present invention.

Referring now to FIG. 3, the manner in which the bypass of the memory cell is achieved in the present invention is to simultaneously assert a write cycle and a read cycle, however, all the word lines are held inactive. To illustrate this, in FIG. 3 a single input data line 35 is coupled to a single write driver 33. The single bit from line 35 is written onto the complementary bitlines 40 and 41 and at the same time, the sense amplifier 36 is activated causing the bit to be sensed by the sense amplifier 36. Ordinary write drivers and sense amplifiers well-known in the art may be used. While this reading and writing is occurring a signal is coupled to the decoder 37 which prevents address signals from selecting any of the cells. Thus, for instance, even if an address is present on the input to the decoder 37 that would otherwise cause line 38 to be active and select cell 34, the signal is inhibited and no cells along the bitlines are selected. Thus, in effect, the data from line 35 is coupled directly through the array bypassing the cells and made available at the output of the array.

In FIG. 3 this bypass mode as implemented in the present invention is demonstrated by an active write signal coupled to the write driver 33, an active read signal coupled to the sense amplifier 36 and a signal coupled to the decoder 37 which causes the word lines to remain inactive during the bypass mode. The bypass mode, as presently implemented, is selected during testing when it is necessary to coupled a bit pattern for comparison to comparator.

As can be seen in comparing FIGS. 1 and 2 less substrate area is required for the present invention as illustrated in FIG. 2. In an actual layout where two RAMs are used in an integrated circuit used for communications, a savings in substrate area of approximately 3–4% is realized using the present invention.

Thus, a bypass mode for an SRAM has been described which may be used for testing the SRAM. The mode permits data to be transferred through the bitlines of the array without being stored in the array.

I claim:

1. A method for bypassing data storage in a memory comprising the steps of:

simultaneously asserting a read and a write cycle; and, inhibiting word lines in the memory from becoming active.

2. A bypass mode for a memory comprising:

means for simultaneously writing data onto bitlines in the memory and reading data from the bitlines; and, means for preventing any cells in the memory from being selected during the bypass mode.

3. In a static random access memory having a plurality of bitline pairs, each of the bitline pairs being coupled to memory cells, the memory cells being selected by word lines and where the bitlines are coupled to write drivers for writing data into the cells and to sense amplifiers for sensing data coupled on to the bitlines from the cells, an improvement comprising:

a compare circuit;

a data path coupled from the sense amplifiers to the compare circuit; and, a mode for writing data onto the bitlines while sensing data from the bitlines with the sense amps without selecting the memory cells.

4. A bypass mode for a memory having a plurality of memory cells comprising:

write drivers for receiving data;

a plurality of bit lines coupled to the write drivers and the memory cells;

sense amplifiers coupled to the bit lines; and, lines coupled to the write drivers and sense amplifiers for receiving signals that simultaneously cause the data to be coupled onto the bit lines by the write drivers and the sense amplifiers to read the data from the bit lines without selecting the memory cells.

* * * * *